United States Patent [19]

Erbert

[11] Patent Number: 4,638,110

[45] Date of Patent: Jan. 20, 1987

[54] METHODS AND APPARATUS RELATING TO PHOTOVOLTAIC SEMICONDUCTOR DEVICES

[75] Inventor: Virgil Erbert, Tijeras, N. Mex.

[73] Assignee: Illuminated Data, Inc., Albuquerque, N. Mex.

[21] Appl. No.: 744,424

[22] Filed: Jun. 13, 1985

[51] Int. Cl.$^4$ ................... H01L 27/14; H01L 31/18
[52] U.S. Cl. .................................... 136/246; 29/572; 427/75; 219/121 LL; 428/138; 428/142
[58] Field of Search .................. 136/244, 246, 250; 29/572, 580, 582, 588, 591; 148/1.5; 156/644; 427/43.1, 53.1, 74, 75, 86, 87, 89; 219/121 LL; 428/138, 142, 312.2, 312.6, 312.8

[56] References Cited

U.S. PATENT DOCUMENTS

| | | | |
|---|---|---|---|
| Re. 30,384 | 8/1980 | Kaplow et al. | 136/246 |
| 2,428,537 | 10/1947 | Veszi et al. | 136/244 |
| 2,777,040 | 1/1957 | Kazan | 338/17 |
| 3,994,012 | 11/1976 | Warner, Jr. | 136/246 |
| 3,999,283 | 12/1976 | Dean et al. | 29/572 |
| 4,042,417 | 8/1977 | Kaplow et al. | 136/246 |
| 4,110,122 | 8/1978 | Kaplow et al. | 136/249 |
| 4,200,472 | 4/1980 | Chappell et al. | 136/246 |
| 4,332,973 | 6/1982 | Sater | 136/246 |
| 4,473,737 | 9/1984 | Anthony | 219/121 LL |

FOREIGN PATENT DOCUMENTS 58-68988 4/1983 Japan ................... 136/246

*Primary Examiner*—Aaron Weisstuch
*Attorney, Agent, or Firm*—H. Michael Brucker

[57] ABSTRACT

A solar concentrator-photovoltaic module having a matrix of miniaturized photovoltaic cells is formed by using a laser beam to form the miniaturized photovoltaic cell sites in situ. A laminated sheet is formed by a light-transmissive lens sheet having a matrix of lenses, and a substrate including a conductor layer formed onto the bottom side of the lens sheet. The laminated sheet is then irradiated using laser beams directed normal to and through each lens of the lens sheet, to perforate the substrate including the conductor layer forming cell sites. Cells can be formed in situ by applying an amorphous or multi-crystalline semi-conductor material to the cell sites from the bottom of the laminated sheet. The laminated sheet is then irradiated further with laser beams directed through each of the lenses, to thereby convert the amorphous material to a properly doped and fully crystalline photovoltaic junction. The bottom of the laminated sheet is then coated with final lower conductive and sealing layers to protect the laminated sheet from environmental effects.

45 Claims, 12 Drawing Figures

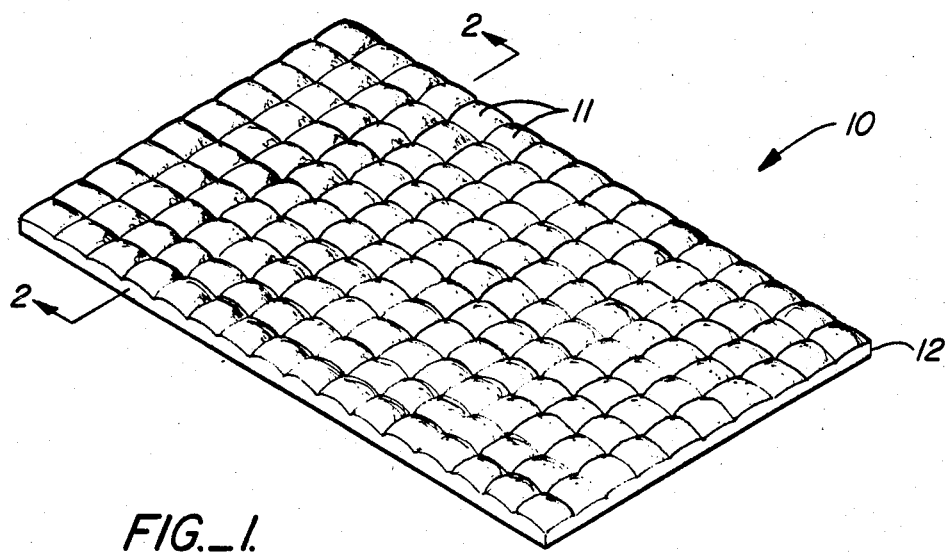
FIG._1.
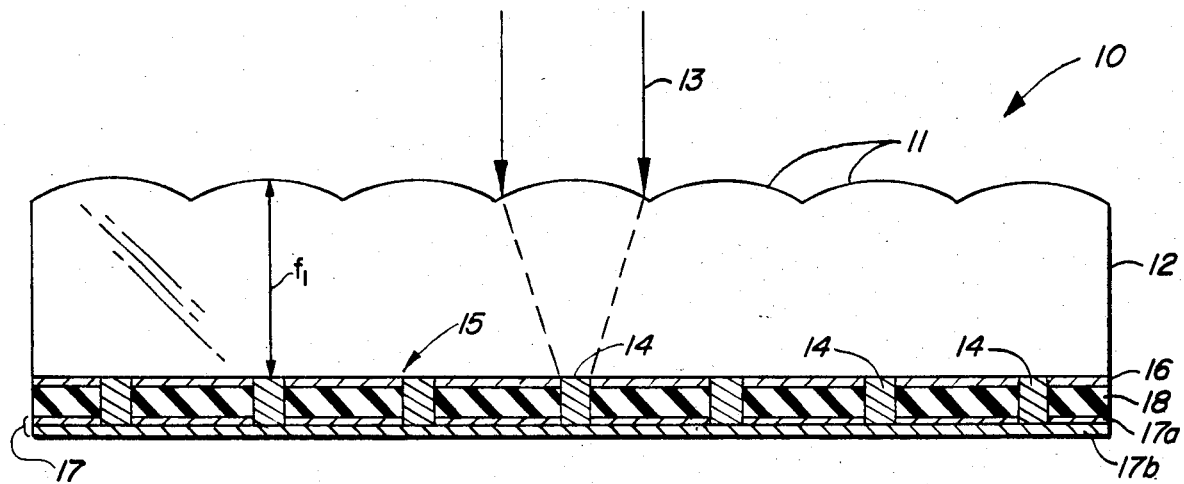
FIG._2.

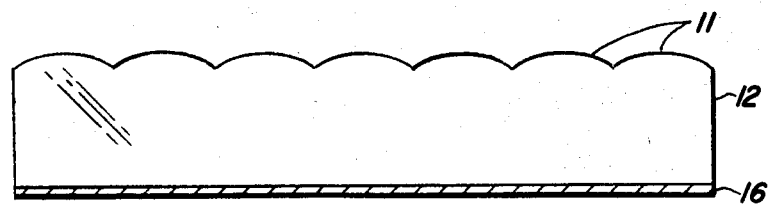
FIG._3.
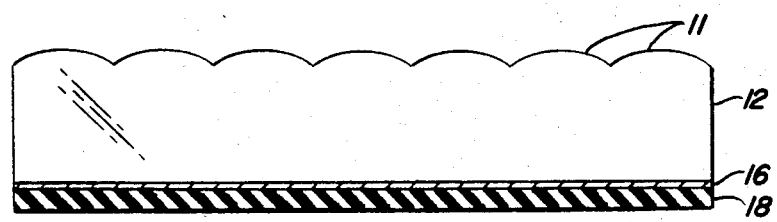
FIG._4.
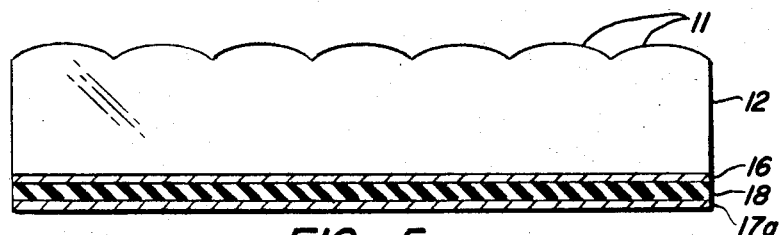
FIG._5.
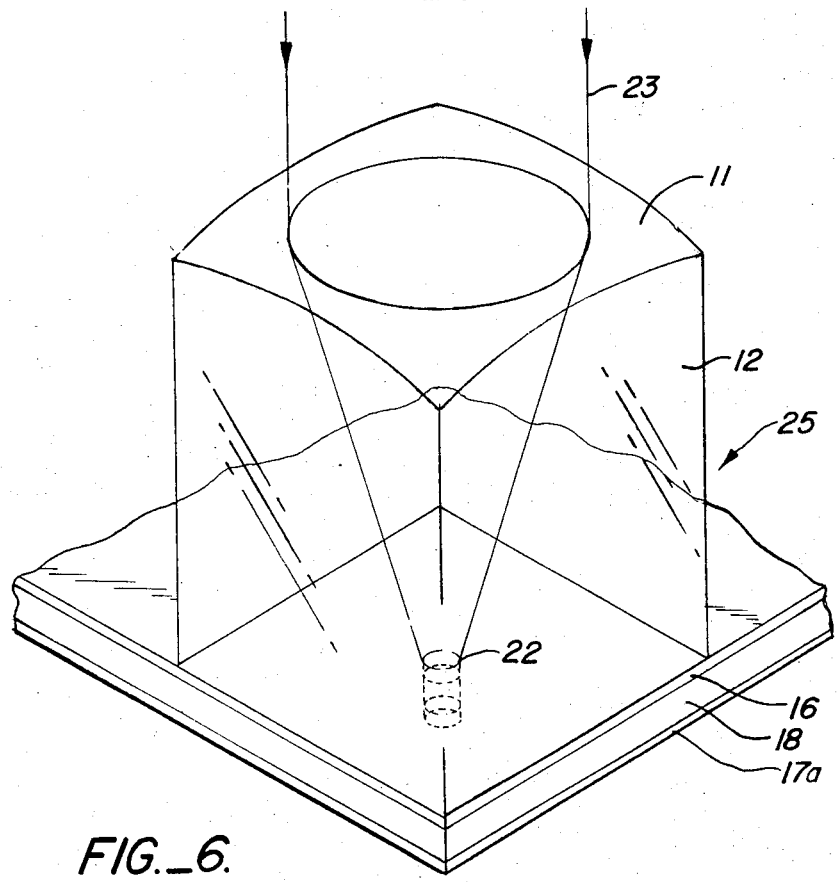
FIG._6.

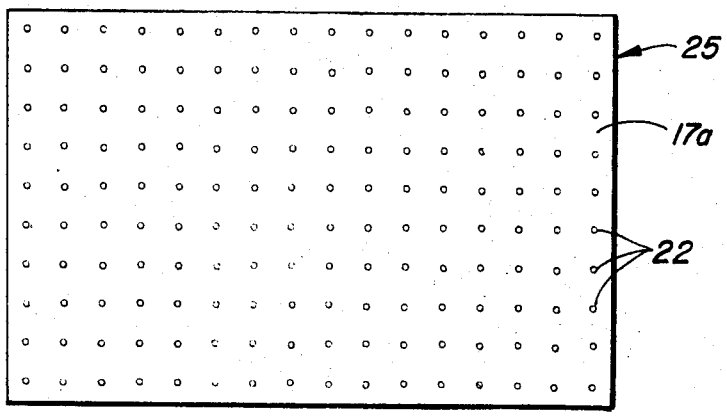
FIG._7.
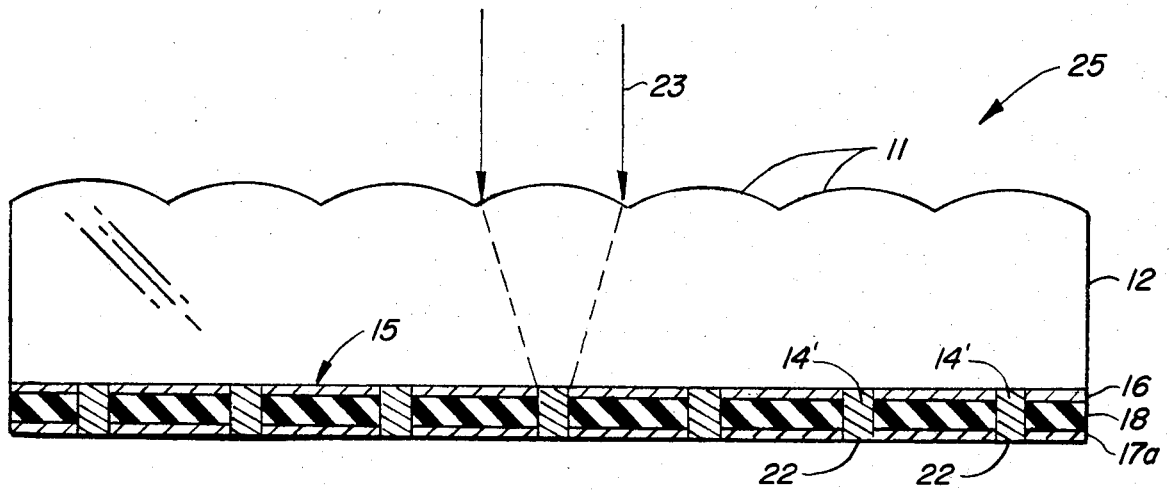
FIG._8.
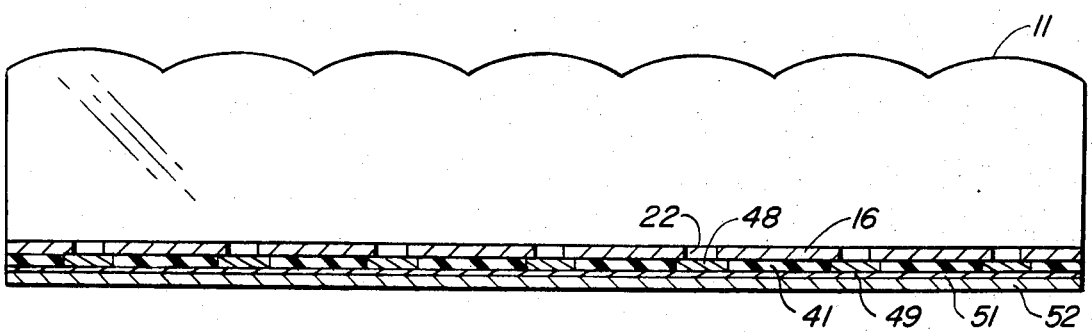
FIG._9.

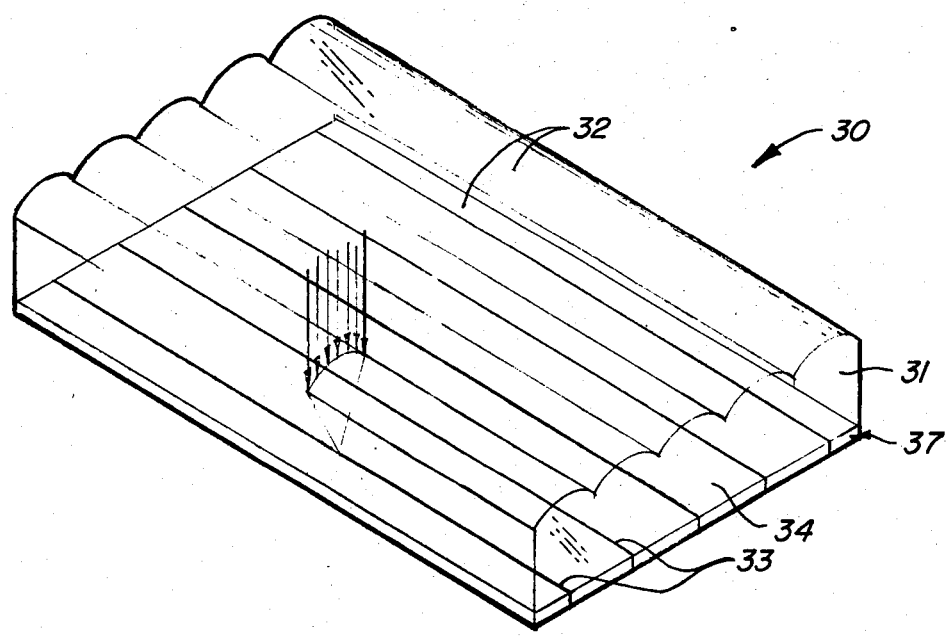
FIG._10.
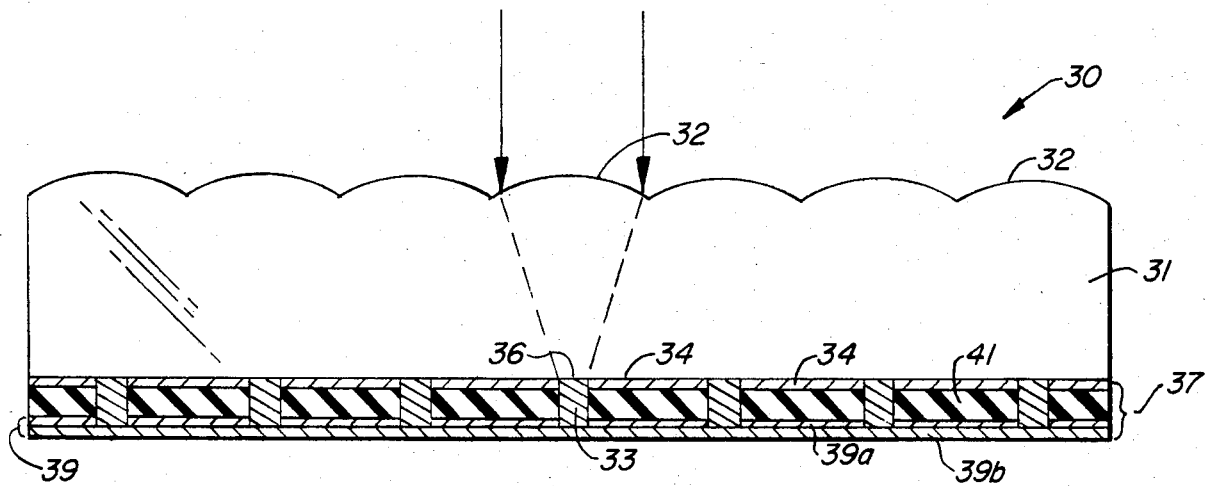
FIG._11.
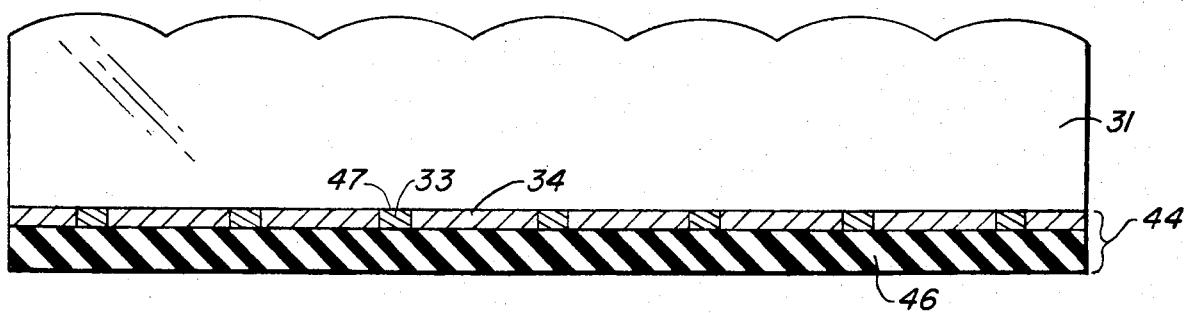
FIG._12.

METHODS AND APPARATUS RELATING TO PHOTOVOLTAIC SEMICONDUCTOR DEVICES

BACKGROUND OF THE INVENTION

The present invention relates generally to photovoltaics (PV) and more specifically to concentrator photovoltaic modules as well as methods for making such modules.

Generating electricity directly from sunlight by the irradiation of semiconductor materials has been the subject of investigation for a number of decades without great commercial success. Simply stated, the cost of generating electricity in this manner is not cost effective except in rare specialized circumstances.

Photovoltaic converters can be classified in two general categories: those that use lens concentrators and those that do not. By the use of lens concentrators the amount of sunlight directed to a cell can be multiplied many times. Concentrator PV modules have inherent problems of their own, however, which often make their use questionably efficient. For example, while the heat generated by the sun on cells without concentrators can be dissipated by convection sufficiently to allow the system to operate at tolerable temperatures, the same is not true of cells with concentrators which require supplemental cooling. Although pump driven fluid cooling provides a solution to the heat problem, the initial capital cost, the cost of operation and the complexities attendant fluid cooling systems detracts from the overall economics. In addition, the housings that support concentrator lenses which typically have focal lengths of 6-12 inches or more, and the fluid cooling plumbing create apparatus which is massive and thus difficult and expensive to deploy and adopt to sun tracking mechanisms.

Heat losses are also experienced as a result of current flowing in semiconductor surfaces ($I^2R$ heat). To reduce this problem it is common practice to overlay sheets of semiconductor material with a mesh of fine conductors to reduce the distance that current must travel in the semiconductor material and thus reduce resistance heating losses. This mesh structure, however, is located between the cell and the sunlight and thus reduces the area of semiconductor material that receives light. In addition, if the mesh structure is made too fine, production yield becomes unacceptable. This so-called shadow effect can be significant and forces a trade-off between losses due to resistance ($I_2R$) and the amount of material irradiated. Further, the resistance of the fine wire conductors creates even further resistance losses.

SUMMARY OF THE INVENTION

The present invention includes apparatus useful in photovoltaic energy generation and methods for making that apparatus. The theme of the inventions—both as to the methods and apparatus—is miniaturization. Unexpectedly large results in terms of reductions of cost per watt to manufacture, higher efficiency, and ease of operation are achieved from the extreme change of scale taught by the present invention. Sheets of plastic or glass less than $\frac{1}{4}$ inch thick embossed on one side with tiny lenses, such as fly's-eye lenses, form the concentrators onto which extremely small photovoltaic cells only microns thick are formed. The tiny lenses are first used in the process of forming the PV cells and then used to direct focused sunlight onto the cells during operation. Because each lens locates the placement of its associated cell, it will automatically direct concentrated incident sunlight onto the cell. Thus perfect registration of the concentrator and the cells is achieved automatically without the use of masks and elaborate registry schemes.

The methods of the invention produce thin sheets of PV modules which because of the extremely small size of each cell can dissipate sufficient heat by conduction and convection alone to permit the advantageous use of concentrators without supplemental cooling apparatus. In addition, the small dimensions make all distances between cell materials (crystals) and conductors very short, thereby greatly reducing $I^2R$ losses associated with current travel over semiconductor crystal surface. The conductors on the other hand, are relatively large and thus minimize conductor resistance losses.

In general, where the prior art applies semiconductor material over an entire surface which is then overlain with a fine mesh of conductors, the present invention covers an entire surface with conductor material which is then overlain with an array of very fine semiconductor cells. In addition to the several other advantages pointed out above and discussed in greater detail below, the arrangement of the present invention completely eliminates the shadow effect losses. Since the most expensive component of PV modules is the semiconductor material, the use of miniature cells as taught by the present invention permits the manufacture of PV modules at a small fraction of the cost/watt of presently known modules.

In addition, the thin light weight sheets of PV modules of the present invention are less costly and easy to handle and adaptable to sun tracking schemes not possible with the massive, heavy, fluid-cooled systems known in the prior art.

A method of the invention for producing a solar concentrator/photovoltaic module comprises first forming a light-transmissive sheet having a first side formed to include a matrix of lenses and an opposing generally flat second side. Onto the second side of the lens sheet is deposited a substrate including a conductor layer. This laminated substrate is irradiated (for example, using a powerful laser beam) through each lens of the lens surface to perforate the substrate, forming voids or cell sites for receiving photovoltaic crystals. To form cells in situ, an amorphous semiconductor material is then deposited into the perforations (cell sites). Next, the amorphous material is converted to a properly doped and fully crystalline photovoltaic junction by again passing a laser beam through each of the lenses, this time concentrating the laser beam to heat and anneal the amorphous material in situ.

In one embodiment of the invention, the laser beam may remain in position for both the perforation and the converting steps, with the laminate moved in stepping fashion serially through all of the rows and columns to first perforate the cells, with amorphous semiconductor material then applied from the bottom side, and then with the laminate module again passed through similar movements to irradiate each cell to anneal the semiconductor material therein.

After the annealing step, the bottom of the laminated sheet is covered with a final lower conductive layer to overlie the existing bottom conductive layer and the exposed cells now in place, thereby sealing and protecting the laminated sheet from environmental effects.

Additional organic sealing may then be applied to further protect the module.

The resulting solar concentrator/photovoltaic module may be connected in series or in parallel with similar modules, and current may be drawn off by connecting conductors to the upper and lower conductive layers.

In accordance with this method, tiny photovoltaic cells are automatically located precisely under each lens in the concentrator lens sheet as a result of the in situ formation of the cells.

Because of the extreme miniaturization of the cells of the present invention, heat buildup, at each cell is easily and quickly carried away by conduction and convection to the ambient air without any need for liquid cooling or other special heat exchangers. Plastic materials (such as methylmethacrylate) are known which are suitable as lens sheets and are able to stand up to temperatures of up to 300° F. Since the modular system of the invention will operate, with convection heat removal only, at a temperature of only about 120° F., sheet material stability in the environment of the module is not a problem.

It is therefore among the objects of the invention to form a photovoltaic solar conversion system in a highly efficient and cost effective manner by using novel steps and apparatus for in situ location and formation of the cells and to provide such a system in a matrix of a large number of miniaturized concentrator cells so that losses are held to a minimum and heat may be removed by simple conduction and convection. These and other objects, advantages, features and characteristics of the invention will be apparent from the following description of preferred embodiments, considered along with the accompanying drawings.

DESCRIPTION OF THE DRAWINGS

FIG. 1 is a perspective view showing a solar concentrator-photovotaic cell module in accordance with the invention, including a multiplicity of lenses arranged in a grid-like matrix.

FIG. 2 is an enlarged sectional elevation view of a portion of the module shown in FIG. 1 taken along line 2—2.

FIGS. 3, 4, and 5 are a series of side sectional elevation views of a lens sheet of the invention illustrating the resulting product at various stages in the process.

FIG. 6 is an enlarged view, in perspective, of one lens and associated substrate.

FIG. 7 is a bottom view of a laminated sheet of the invention, having cell sites formed therein.

FIG. 8 is a side sectional elevation view illustrating a product of the invention at a stage of development beyond that illustrated in FIG. 5.

FIG. 9 is a side sectional elevation view illustrating a module produced by an alternative method of the invention.

FIG. 10 is a perspective view of an alternative embodiment of the solar concentrator-photovoltaic cell module of the invention, wherein photovoltaic cells are formed in thin lines rather than a matrix of circular cells.

FIGS. 11 and 12 illustrate, by side sectional elevation views, alternative embodiments of substrates for the embodiment of the invention illustrated in FIG. 9.

DESCRIPTION OF PREFERRED EMBODIMENTS

Referring to FIGS. 1 and 2, a solar concentrator-photovoltaic cell module 10 formed in accordance with the principles of the invention, includes a lens sheet 12 of plastic or glass having tiny fly's-eye lenses 11 formed in its upper structure in a grid-like matrix. Each lens 11 is preferably of rectangular or square cross-section, but optically spherical. The lens sheet 12 as will be more fully described below, serves several functions, including an environmental encapsulation, a substrate support, and a heat sink. Although FIG. 2 is not to scale, it generally indicates that the focal length $f_1$ of each lens 11 is longer than the width of the lens, preferably but not necessarily about 2.5 to 3 times the width. In operation, a beam of light 13 (which is parallel light) strikes the lens surface and is focused to converge and concentrate at photovoltaic cell 14 (junction). The dimensions of cell 14 are much smaller than the dimensions of the lens 11, and may be sized for a concentration ratio of about 50 to 100. To give an idea of the degree of miniaturization involved, cell diameters are preferably of 0.001 to 0.005 inch.

In one embodiment, the module further comprises a substrate 15 which is made up of a layer of conductive material such as copper or tin forming a first conductor 16, a layer of insulating material such as silicon dioxide forming an insulator 18, and two layers of conductive material 17a and 17b (also preferably copper or tin) which form a bottom or second conductor 17. The conductive layers are in electrical contact with the photovoltaic cells 14 and separated from each other by insulator 18. All of the photovoltaic cells 14 are in electrical parallel, so long as they make contact with the same first conductor 16 and second conductor 17. Separate sections of photovoltaic modules 10 may be connected in electrical series to produce higher voltages.

The solar concentrator/photovoltaic module 10 is formed by a unique and highly efficient process in accordance with the invention, greatly saving on the cost of materials as well as the cost of manufacturing, while producing a highly efficient photovoltaic structure.

Referring to FIGS. 3-5, the process of the invention starts with the formation of a lens sheet 12, preferably of a clear and optically suitable plastic or glass material having good structural strength and reasonably good heat conducting characteristics. The lens sheet may be formed by any of several processes, such as molding, embossing, or extruding, preferably in strip form. A suitable material for the lens sheet 12 is methylmethacrylate.

The lens sheet 12 has a generally planar bottom surface which is coated with a metal layer as by chemical deposition, electroplating, or other suitable coating method to form first conductor 16 (see FIG. 3).

Next, an insulating layer is deposited or otherwise coated on the conductor 16 (see FIG. 4) to form insulator 18.

Next (FIG. 5) an ohmic bottom conductor 17a is formed by depositing a layer of conductive material on the underside of the insulating layer 18. The ohmic conductor 17a is a thin layer, only about 1 micron thick of the same material as top conductor 16. The insulator layer 18 is preferably thicker by several times than both conductors 16 and 17a.

Referring to FIGS. 6 and 7, a void or cell site 22 is formed through the top conductor 16, the insulator 18, and the bottom conductor 17a, by the action of a powerful light beam 23, such as a laser beam. The energy of the beam is concentrated by lens 11 sufficiently to form a hole through the laminated substrate and thereby create cell site 22. The curvature of the spherical lens 11, and the thickness of the lens sheet 12 are selected when forming the lens so that the lens will have a focal length $f_1$ (see FIG. 2) which will cause the light beam 23 to be concentrated and sized to create a cell site 22 of desired dimensions. The size of each cell site 22 is selected to be slightly larger than the solar image to be focused at the site, to allow for some tracking error. Within this limit, all of the solar image will enter the active region of each cell.

Referring to FIG. 8, after cell sites have been formed, the intermediate structure 25 comprises the lens sheet 12 with a substrate 15 formed onto its planar bottom surface and perforated by a matrix of cell sites 22. The structure 25 is an intermediate product which together with the method of its formation are important inventions.

Of particular importance is the fact that the beam 23 passed through and was focused by lens 11 to locate each cell site 22, thus assuring that when the module is operative to convert sunlight to electricity, the sunlight will be directed precisely to the cell site 22 which will then contain an active crystal, as more fully described below. Thus, perfect alignment is achieved without masking or the need for other registry schemes.

Referring to FIG. 8, the next step in the process of forming a complete module 10 is to fill the cell sites with amorphous or poly-crystalline semiconductor material 14' such as doped silicon or one of the other semiconductor materials known to produce a current in response to solar radiation.

It is important to have in mind the relative dimensions of the cell sites 22 to appreciate the next step. As pointed out above, the combined thickness of the substrate 15 in which the cell sites are formed is substantially less than the cell site diameters which are preferably in the range of 0.001 to 0.005 inch. Thus, the introduction of amorphous semiconductor material onto the cell sites can be accomplished in several ways, including vacuum evaporation (using a mask), sputtering, silk-screening, etc. Whatever method is employed it is necessary for the material to make good contact with both the upper conductor 16 and the ohmic bottom conductor 17a, and which is accomplished by laser heating of the interface regions.

After semiconductor material has been introduced into each cell site 22, the next step is to irradiate the material in each cell using a laser beam 23, or other suitable energy in the visible or invisible spectrum, to focus on each cell and to convert the semiconductor material 14' to a properly doped fully crystalline photovoltaic junction 14 (see FIG. 2). Techniques for zone refining, doping, crystal growing (annealing), and establishing electrical contact of semiconductors by means of focused laser light and electron beams are documented in "Laser Annealing of Semiconductors" by J. M. Poate and J. W. Mayer, 1981, Academic Press. The energy used for this conversion may be, for example, a laser beam, an electron beam, or hot filament scanning. The only requirement is that enough energy be focused at each cell to make the conversion. Once again the lenses 11 come into play to focus energy at the cell site to make the conversion.

The final step is the deposition of a secondary conductive layer 17b (FIG. 2) to overlie the existing ohmic bottom conductor layer 17a, and to merge conductively with it and the photovoltaic material 14 at each photocell. The secondary lower conductor layer 17b also acts to seal the laminated module 10 against environmental effects.

By the described method, both the location and formation of the photovoltaic cells 14, as well as the irradiation of the cell material which converts them to photovoltaic junctions, is accomplished in situ, and through the same locating lenses.

Referring to FIG. 9, an alternative method of the present invention involves formation of cells by securing in place by known methods already formed miniature photovoltaic crystals, as opposed to forming such crystals in situ as described above. In this alternative method, the step of concentrating a laser beam through the lens 11 to form cell sites is performed after the deposition of the upper conductor 16 (See FIG. 3). Individual crystals 48 are then secured at each cell site 22 with the individual crystals sized to be slightly larger than the cell sites formed in the conductor 16. The crystals can be adhered to the conductor 16 at the cell sites by the use of a solder cream or predeposited solder which can be heated by radiation through the lenses 11, once again, to form a good connection between the conductor 16 and the individual crystals 48. Once the crystals have been secured at the cell sites, an insulating layer 41 is formed over the entire conductive surface but not onto the backsides 49 of the crystals 48 which must remain exposed. Once the insulating layer has been formed, an ohmic conductor layer 51 is applied over the entire insulating surface and the backsides of the crystals to establish a good electrical connection between the conductor 51 and the crystals 48. Finally, a more substantial conductive layer 52 is applied over the conductor 51 in order to provide for good current flow. The resulting substrate is electrically equivalent to that produced by the in situ method as illustrated in FIG. 8.

FIG. 10 illustrates an alternative embodiment of the invention. In this embodiment, a lens sheet 31 comprises a series of elongated thin cylindrical lenses 32 which span an entire module 30 dimension.

Accordingly, photovoltaic cells 33 in this form of the invention comprise long thin lines of active material disposed between strips 34 of conductive metal. The long thin photovoltaic cells 33 may be disposed either vertically, as described in connection with the previous embodiment and as illustrated in FIG. 11 or horizontally as illustrated in FIG. 12.

Referring also to FIG. 11, the long strips of semiconductor crystals 33 are disposed in cell sites 36 formed in a laminated substrate 37 which is deposited on the bottom planar surface of lens sheet 31. Substrate 37 comprises upper conductors 34, a lower conductor 39 and an intermediate insulator 41. The same materials as described in connection with the embodiment of FIGS. 1-8, are applicable with regard to the embodiment of FIGS. 10-12, including a two layer (39a, 39b) construction of bottom conductor 39 which results in encapsulation of the active crystal 33 protecting it from environmental effects. In this embodiment, however, upper conductors 34 are individual long strips separated from one another by the cells 33. The bottom conductor 39 is electrically continuous throughout by virtue of the encapsulating lower layer 39b thereof.

In this embodiment, electrical potential is developed "vertically" between conductors 34 and 39 in precisely the same manner as the embodiment in which the the cells are circular rather than linear. A modification of this embodiment described below permits the development of higher voltages without the interconnections necessary with the embodiments heretofore described.

Referring to FIG. 12, a lens sheet 31 has a substrate 44 comprised of upper layer conductor strips 34 and an encapsulating insulation layer 46. In this embodiment, the cells 33 are in cell sites 47 which penetrate only through the upper layer conductors 34.

In this embodiment, the process for forming the cells is somewhat simplified in that the lens sheet 31 has deposited on its lower planar surface a substrate of a single layer of conductive material which is then exposed to radiation for the purpose of perforating the upper layer with longitudinal strips which become the cell sites 47. The cells are then formed in situ in the cell sites in the same manner as described in connection with the circular cells of the previously described embodiment, after which an encapsulating protective layer 46 of insulating material is applied.

In the embodiment of FIG. 12, the voltages are established "horizontally" across cells 33 by suitably doping one edge of the cell and are additive, enabling higher voltages to be developed without requiring interconnections. This has the added advantage that currents are greatly reduced, resulting in less $I^2R$ energy loss in the conductors.

The extreme miniaturization of the photovoltaics in accordance with the invention saves in material and production costs, and increases the efficiency of the resulting photovoltaic modules as well as enabling convection cooling of the photovoltaic structures eliminating the need for liquid cooling or other special heat exchangers. It further enables a high concentration of solar energy, not limited by heat buildup as in prior art large scale systems. The lens sheet as well as upper and lower (where they exist) conductors act as heat sinks and efficient dissipators of heat at each cell. Operating temperatures at each junction are minimal, resulting in high efficiency and long life of each cell. Therefore, higher concentration ratios than those normally considered practical can be used without overheating the miniaturized structures and without requiring active cooling. Higher concentration ratios lead to still higher efficiency. Overall efficiencies approaching twenty to twenty-five percent can be achieved using the present invention with careful design.

Since the miniaturization as well as the procedure outlined above for producing the solar concentrator/photovolatic modules of the invention result in a great reduction in the quantity of photovoltaic material used, highly efficient but more expensive photovoltaic material may be employed without adding significantly to the cost of the modules. Gallium arsenide, for example, has a higher efficiency than silicon in photovoltaics, and can be deposited in layers much thinner than required for silicon. For example, a gallium arsenide layer of ten microns thickness may be equivalent to silicon of 100 or more microns thickness. This decreases cost in several ways, including the use of less material, shorter deposition time, less annealing times, and the requirement of less processing energy. In addition, the heat flow rate out of a gallium arsenide crystal is approximately ten times as fast as the heat flow rate out of a silicon layer. Gallium arsenide can withstand about twice the temperature of silicon without loss of efficiency, thereby further increasing the useable concentration and reducing further the amount of photovoltaic material required. In some cases, a 20 to 1 savings can be expected by the use of gallium arsenide instead of silicon material, offsetting its higher cost.

In the photovoltaic structure of the invention, the top conductor layer 16 covers nearly all of the upper layer, with only small holes or thin lines over the cell material interrupting this conductor layer. The top conductor is therefore able to act as a good heat sink and heat conductor. Very small heat sources (the cells) located on very large heat sink areas (the conductor layers), allow very rapid heat transport over short distances so that the tiny cells are well-cooled by the adjacent conductive sheets alone.

Another benefit of the structure of the invention is that losses due to current traveling through semiconductor material or very small conductors are very low due to the very short path from any cell to a conductor layer. Thus, relatively small $I^2R$ heat losses are experienced.

In the circular lens cell embodiment, all of the cells in a given module are connected in parallel. To obtain higher voltages, such as commonly used 12 volts, the conductive layers can be divided into a number of separate sections by etching through the layers along appropriate lines and connecting the sections in series rather than in parallel. Thus, with a minimum of interconnecting circuitry, higher module voltages can be readily obtained.

The completed laminate comprising the solar concentrator/photovoltaic module 10, is preferably formed in elongated strips. The strip formation may be in a substantially continuous process. An appropriate module size section may then be cut from a manufactured strip, as desired.

The strips or modules are assembled into larger units and mounted on solar tracking assemblies. Such units and tracking assemblies are much lighter in weight and smaller in size for a given output, than prior art concentrator assemblies, further adding to the savings made possible.

The precise dimensions of the various components of the present invention are dependent largely on the choice of materials and the heat transmissive and light absorption qualities of those materials. The scale selected will be a "miniaturization" if the concentrator lenses and associated cell forming substrate form a photovoltaic laminate capable of sustained operation at tolerable temperature levels without the aid of supplemental cooling apparatus.

The following dimensions provide practical upper limits for presently known materials for photovoltaic uses as well as preferred ranges. If lenses are optically spherical and geometrically square, they should not exceed ¼ inch on one side or ⅜ inch thick. If they are cylindrical they should not exceed ⅜ inch in their transverse dimension (across the lens) and ⅜ inch thick. The circular cell sites should not exceed 0.010 inch in diameter (across) and the long narrow cell sites should not exceed 0.010 inch in width (across). The substrate should not exceed 250 microns in thickness. A preferred embodiment using silicon crystals would be within the following ranges: lenses 0.02 to 0.04 inch on a side or across; lens sheet 1/16 to 1/18 inch thick; concentrations of 50-100; cell sites 0.001 to 0.005 inch across; and the substrate approximately 150 microns thick. The substrate thickness is determined by the crystal thickness which for silicon needs to be about 150 microns for proper light absorption. The conductors are only 1-5 microns thick, with the insulator making up the remaining thickness. For gallium arsenide, substrate thickness of about 15-20 microns would be more correct.

The above-described preferred embodiments illustrate the principle and operative features of the invention, but are not intended to be limiting. Various other embodiments will be apparent to those skilled in the art and may be made without departing from the spirit and scope of the invention as defined in the following claims.

What is claimed is:

1. A method of forming a laminate for holding photovoltaic material at cell sites and concentrating incident radiation at such cell sites, comprising:
    forming a light-transmissive lens sheet having a first side in which a pattern of lenses is formed and an opposing second side which is generally planar;
    laminating a substrate including a layer of electrically conductive material onto the second side of the lens, sheet; and
    perforating the laminated substrate to form a plurality of cell sites by irradiation focused by the lenses of the lens sheeet.
2. The method of claim 1 wherein the lenses are optically spherical.
3. The method of claim 2 wherein the step of laminating said substrate comprises:
    depositing a layer of electrically conductive material onto the second side of the lens sheet to form a first conductor;
    depositing a layer of electrically insulating material onto the first conductor to form an insulator;
    depositing a layer of electrically conductive material onto the insulator to form a second conductor.
4. The method of claim 2 wherein the substrate comprises a single layer of conductive material.
5. The method of claim 4 further comprising the steps of:
    securing photovoltaic semiconductor crystals slightly larger than cells sites onto the substrate overlying cell sites;
    depositing a layer of insulating material onto the substrate between adjacent crystals whereby the surfaces of the crystals not secured to the substrate remain exposed;
    depositing a continuous ohmic layer of conducting material over the then existing substrate including the exposed surfaces of the crystals whereby the crystals are electrically connected.
6. The method of claim 5 comprising the further steps of depositing an additional layer of conductive material onto the ohmic layer.
7. A photovoltaic module formed in accordance with the method of claim 6.
8. A photovoltaic module formed in accordance with the method of claim 5.
9. The method of claim 2 wherein the lenses have square cross-sections and are arranged in abutting relationship to form a continuous surface of spherical lenses.
10. The method of claim 9 wherein the lenses are less than ¼ inch on a side.
11. The method of claim 1 wherein the lenses are optically cylindrical.
12. The method of claim 11 wherein the step of laminating said substrate comprises:
    depositing a layer of electrically conductive material onto the second side of the lens sheet to form a first conductor;
    depositing a layer of electrically insulating material onto the first conductor to from an insulator;
    depositing a layer of electrically conductive matieral onto the insulator to form a second conductor.
13. The method of claim 11 wherein the substrate comprises a single layer of conductive material.
14. The method of claim 13 further comprising the steps of:
    filling the cell sites with amorphous semiconductor material;
    converting the amorphous semiconductor material in the cell sites to a properly doped and fully crystalline photovoltaic junction;
    depositing a layer of insulating material onto the existing substrate to seal and protect the junctions.
15. The method of claim 14 wherein the amorphous semiconductor material is gallium arsenide.
16. A photovoltaic module formed in accordance with the method of claim 14.
17. The method of claim 11 wherein the lenses are arranged in side-by-side relationship to form a continuous surface of parallel lenses.
18. The method of claim 17 wherein the lenses are less than ⅜ inch across.
19. The method of claim 1 wherein the lenses produce an image concentration onto the substrate of at least 50 times.
20. The method as in one of claims 1, 2 or 11 wherein perforation of the substrate is accomplished by use of a laser focused by the lenses of the lens sheet.
21. A concentrator laminate for holding photovoltaic material at cell sites and concentrating incident radiation at such cell sites formed in accordance with the method of any one of Claims 1-19, inclusive.
22. The method as in one of claims 1, 2 or 11 comprising the further steps of:
    filling the cell sites with amorphous semiconductor material;
    converting the amorphous semiconductor material in the cell sites to a properly doped and fully crystalline photovoltaic junction.
23. The method of claim 22 wherein the step of converting the amorphous semiconductor material includes irradiation of the material in the cell sites by radiation focused through the lenses of the lens sheet.
24. The method of claim 22 wherein the amorphous semiconductor material is gallium arsenide.
25. A photovoltaic module formed in accordance with the method of claim 22.
26. The method as in one of claims 1, 2 or 11 comprising the further steps of:
    filling the cell sites with amorphous semiconductor material;
    converting the amorphous semiconductor material in the cell sites to a properly doped and fully crystalline photovoltaic junction;
    depositing an ohmic layer of conductive material onto the existing substrate to form a continuous conductor electrically connecting all of the junctions.
27. A photovoltaic module formed in accordance with the method of claim 26.

28. A laminated sheet product useful in photovoltaic devices comprising:
  a light-transmissive lens sheet having a first side in which a matrix of a multiplicity of concentrating lenses is formed and having an opposing substantially flat second side;
  a substrate adhered to the second side of said lens sheet including a layer of electrically conductive material forming a first conductor;
  a matrix of voids forming cell sites in said substrate extending at least through the first conductor and optically below the concentrating lenses whereby radiation concentrated by a lens is directed to a cell site for a selected angle of incidence of the radiation.

29. The invention of claim 28 wherein the lenses are optically spherical.

30. The invention of claim 29 wherein the lenses are optically cylindrical.

31. The invention of claim 30 wherein said substrate comprises:
  a layer of electrically conductive material on the second side of the lens sheet defining a first conductor;
  a layer of electrically insulating material on the first conductor defining an insulator;
  a layer of electrically conductive material on the insulator defining a second conductor.

32. The invention of claim 30 wherein the substrate comprises a single layer of conductive material.

33. The invention of claim 30 wherein the lenses are arranged in side-by-side relationship defining a continuous surface of parallel lenses.

34. The invention of claim 33 wherein the lenses are less than ⅜ inch across.

35. The invention of claim 33 further comprising:
  a photovoltaic semiconductor crystal in each cell site, in electrical contact with said electrical conductor and optically visible through the lens sheet; and
  a layer of electrically insulating material overlying the conductor and crystals.

36. The invention of claim 29 wherein said substrate comprises:
  a layer of electrically conductive material on the second side of the lens sheet defining a first conductor;
  a layer of electrically insulating material on the first conductor defining an insulator;
  a layer of electrically conductive material on the insulator defining a second conductor.

37. The invention of claim 29 wherein the substrate comprises a single layer of conductive material.

38. The invention of claim 29 wherein the lenses have square cross-sections and are arranged in abutting relationship to form a continuous surface of spherical lenses.

39. The invention of claim 38 wherein the lenses are less than ¼ inch thick on a side.

40. The invention of claims 36 or 31 further comprising:
  a photovoltaic semiconductor crystal disposed in each cell site wherein the crystal is in electrical contact with both the first and second conductors and optically visible through the lens sheet.

41. The invention of claim 40 further comprising:
  a layer of electrically conductive material overlying the second conductor and cell sites which are thereby encapsulated and protected against environmental effects.

42. The invention of claim 40 where the semiconductor material is gallium arsenide.

43. The invention of claim 28 wherein the lenses produce an image concentration onto the substrate of at least 50 times.

44. The invention of any one of claims 28, 29 or 30 further comprising:
  a photovoltaic semiconductor crystal disposed at each cell site, in electrical contact with the first conductor and optically visible through the lens sheet.

45. The invention of claim 44 wherein the crystal material is gallium arsenide.

* * * * *